(12) United States Patent
Krnc

(10) Patent No.: US 9,485,570 B1
(45) Date of Patent: Nov. 1, 2016

(54) ARTICLE AND METHOD FOR MUTING A VOICE AMPLIFIER

(71) Applicant: Advanced Basic Communications, Beachwood, OH (US)

(72) Inventor: Michael Krnc, Medina, OH (US)

(73) Assignee: Advanced Basic Communication, Beachwood, OH (US)

( * ) Notice: Subject to any disclaimer, the term of this patent is extended or adjusted under 35 U.S.C. 154(b) by 100 days.

(21) Appl. No.: 14/618,633

(22) Filed: Feb. 10, 2015

Related U.S. Application Data

(60) Provisional application No. 61/937,724, filed on Feb. 10, 2014.

(51) Int. Cl.
*H04R 3/00* (2006.01)
*A62B 18/08* (2006.01)
*H03F 3/181* (2006.01)

(52) U.S. Cl.
CPC .............. *H04R 3/00* (2013.01); *H03F 3/181* (2013.01)

(58) Field of Classification Search
None
See application file for complete search history.

(56) References Cited

U.S. PATENT DOCUMENTS

| | | | |
|---|---|---|---|
| 5,371,804 A | 12/1994 | Bauer | |
| 5,428,688 A | 6/1995 | Becker et al. | |
| 6,121,881 A * | 9/2000 | Bieback et al. | A62B 18/08 128/201.19 |
| 7,349,551 B2 | 3/2008 | Skillicorn et al. | |
| 7,394,905 B2 | 7/2008 | Miller et al. | |
| 7,457,427 B2 | 11/2008 | Birli et al. | |
| 2007/0049360 A1* | 3/2007 | Birli et al. | H04B 1/385 455/575.2 |

* cited by examiner

*Primary Examiner* — Brenda Bernardi
(74) *Attorney, Agent, or Firm* — Edwin A. Sisson, Attorney at Law, LLC; Jeffrey J. Banyas

(57) ABSTRACT

This specification discloses an improved voice transmission system for a protective mask. The voice transmission system comprises a speaker assembly and a radio transmitter assembly. The speaker assembly comprises speaker components comprised of a first microphone, an amplifier, a batter and a speaker. The radio transmitter assembly comprises radio transmitter assembly components comprised of a radio transmitter microphone selected from the group consisting of the first microphone of the speaker assembly or an optional second microphone, a radio transmitter switch and a radio transmitter. The improvement comprises a radio transmitter communication connection from the radio transmitter switch to at least one device selected from the speaker assembly components which prevents the speaker assembly from emitting a sound from the speaker when the radio transmitter switch allows the radio transmitter to transmit an electronic signal converted from a signal originating from the radio transmitter microphone.

16 Claims, 7 Drawing Sheets

ARTICLE AND METHOD FOR MUTING A VOICE AMPLIFIER

PRIORITY AND CROSS REFERENCES

This application claims priority from U.S. Provisional Application No. 61/937,724 filed on 10 Feb. 2014, the teachings of which are hereby incorporated by reference in their entirety.

FIELD OF INVENTION

This invention relates to gas mask communication devices.

BACKGROUND

Gas masks are designed to keep gasses from entering the breathing space and eyes of the user. As designs have advanced, the seals around the lenses, face lines, and feeding/drinking tubes have improved.

As the seals have improved, it has become more difficult for the user to verbally communicate without the use of specialized equipment such as radio transmitters, microphones, speakers and amplifiers.

Current designs include one or more microphones connected to an amplifier connected to a speaker with the amplifier and speaker typically located outside of the mask. Such speakers project audible verbal communications from the user to those in the area surrounding the user. For example, U.S. Pat. No. 5,428,688 to Becker et al., the teachings of which are incorporated by reference in its entirety, discloses a microphone mounted inside the mask connected to an amplifier and speaker designed to be attached to the belt of a user. U.S. Pat. No. 5,371,804 to Bauer, the teachings of which are incorporated by reference in its entirety, discloses a microphone diaphragm inside the mask connected through the mask to an amplifier and speaker assembly directly mounted on the mask. According to Bauer, the disclosed voice transmission system is designed to receive a person's voice from a voice diaphragm located in the voice emitter passage of the mask, amplify the voice, and externally transmit the voice through the speaker.

U.S. Pat. No. 7,394,905 to Miller et al., the teachings of which are incorporated by reference in its entirety, describes an amplifier and speaker assembly attached to a gas mask with a manual switch to turn the circuit board of the amplifier on or off.

The communication can also occur via the radio transmitter to those in the immediate area or those outside the immediate area. U.S. Pat. No. 7,349,551 to Skillicorn et al., the teachings of which are incorporated by reference in their entirety, describes a lapel mounted microphone connected to a radio transmitter with a push-to-talk device located inside the microphone. As disclosed in FIG. 1 of Skillicorn et al., the microphone is located on the lapel and outside the mask and the user is obliged to speak audibly into the speaker outside the mask.

U.S. Pat. No. 7,457,427 to Birli et al., the teachings of which are incorporated by reference in its entirety, discloses in its background section that some masks include a communication system, such as a voice amplification system or a radio interface system. Some of these systems use microphones and amplifiers to help the user to be heard clearly outside the user's mask, either directly at the location or remotely via radio frequency transmission. Birli et al. further discloses the use of two microphones in the mask Currently, the radio transmitter and speaker are controlled separately, leaving the operator vulnerable when attempting to operate both devices independently. For example, it is often desirable to communicate to others only via radio during military stealth operations when discovery by the enemy can be fatal. The need exists, therefore, for an improved apparatus and method for simultaneously eliminating the audible sound communication from a gas mask speaker while at the same time broadcasting the communications through a radio transmitter.

SUMMARY

Disclosed in this specification is an improved voice transmission system for a protective mask comprising a speaker assembly and a radio transmitter assembly wherein the speaker assembly comprises speaker assembly components comprised of a first microphone, an amplifier, a power source and a speaker with the first microphone, amplifier, battery and speaker configured so that the amplifier amplifies a signal originating from the first microphone to an amplified signal and the speaker converts the amplified signal to a sound; the radio transmitter assembly comprises radio transmitter assembly components comprised of a radio transmitter microphone selected from the group consisting of the first microphone of the speaker assembly or an optional second microphone, a radio transmitter switch located outside the protective mask and a radio transmitter with the radio transmitter microphone, radio transmitter and radio transmitter switch configured so that the radio transmitter switch is capable of allowing or preventing the radio transmitter from transmitting an electronic signal converted from a signal originating from the radio transmitter microphone.

The improvement comprises a radio transmitter switch communication connection from the radio transmitter switch to at least one device selected from the speaker assembly components which prevents the speaker assembly from emitting the sound from the speaker when the radio transmitter switch allows the radio transmitter to transmit the electronic signal converted from the signal originating from the radio transmitter microphone.

In one embodiment the radio transmitter switch communication connection connects at least one speaker assembly component to ground when the radio transmitter switch allows the radio transmitter to transmit the electronic signal converted from the signal originating from the radio transmitter microphone thereby disabling the at least one speaker assembly component. In one such embodiment the at least one speaker assembly component is the amplifier.

In one embodiment the radio transmitter switch communication connection interrupts the connection of at least one speaker assembly component to one of the other speaker assembly components when the radio transmitter switch allows the radio transmitter to transmit the electronic signal converted from the signal originating from the radio transmitter microphone thereby disabling the speaker assembly. In one such embodiment the at least one speaker assembly component is the power source.

In one embodiment the radio transmitter switch communication connection turns off at least one speaker assembly component when the radio transmitter switch allows the radio transmitter to transmit the electronic signal converted from the signal originating from the radio transmitter microphone thereby disabling the speaker assembly. In one such embodiment the at least one speaker assembly component is the amplifier.

In one embodiment the amplifier further comprises an integrated circuit having an amplifier switch capable of turning the amplifier off and the radio transmitter switch communication connection places the amplifier switch in an off position turning the amplifier off.

In one embodiment the power source is a battery. In one such embodiment, the battery is located in the amplifier.

Also disclosed herein is an improved radio transmitter switch for a protective mask comprising a speaker assembly and a radio transmitter assembly wherein the speaker assembly comprises speaker assembly components comprised of a first microphone, an amplifier, a power source and a speaker with the first microphone, amplifier, power source and speaker configured so that the amplifier amplifies a signal originating from the first microphone to an amplified signal and the speaker converts the amplified signal to a sound; the radio transmitter assembly comprises radio transmitter assembly components comprised of a radio transmitter microphone selected from the group consisting of the first microphone of the speaker assembly or an optional second microphone, the radio transmitter switch and the radio transmitter with the radio transmitter microphone, radio transmitter and radio transmitter switch configured so that the radio transmitter switch is capable of allowing or preventing the radio transmitter from transmitting an electronic signal converted from a signal originating from the radio transmitter microphone. The improvement comprises a communication connection in the radio transmitter switch configured to communicate with the speaker assembly in a manner which prevents the speaker assembly from emitting audible sound from the speaker when the radio transmitter switch allows the radio transmitter to transmit an electronic signal converted from a signal originating from the radio transmitter microphone.

In one embodiment the radio transmitter is allowed to transmit the electronic signal converted from the signal originating from the radio transmitter microphone by allowing the electronic signal converted from a signal originating from the radio transmitter microphone to pass to the radio transmitter.

In one embodiment the radio transmitter is allowed to transmit the electronic signal converted from the signal originating from the radio transmitter microphone by turning on the power circuit of the radio transmitter.

In one embodiment the radio transmitter switch prevents the speaker assembly from emitting an audible sound by connecting at least of the speaker assembly components to ground through the communication connection.

In one embodiment the radio transmitter switch prevents the speaker assembly from emitting an audible sound by sending a signal through the communication connection to at least one of the speaker assembly components having a shut down switch.

In one embodiment the radio transmitter switch prevents the speaker assembly from emitting an audible sound by interrupting the connection through the communication connection between any one of the speaker assembly components.

DETAILED DESCRIPTION

Figure 1:
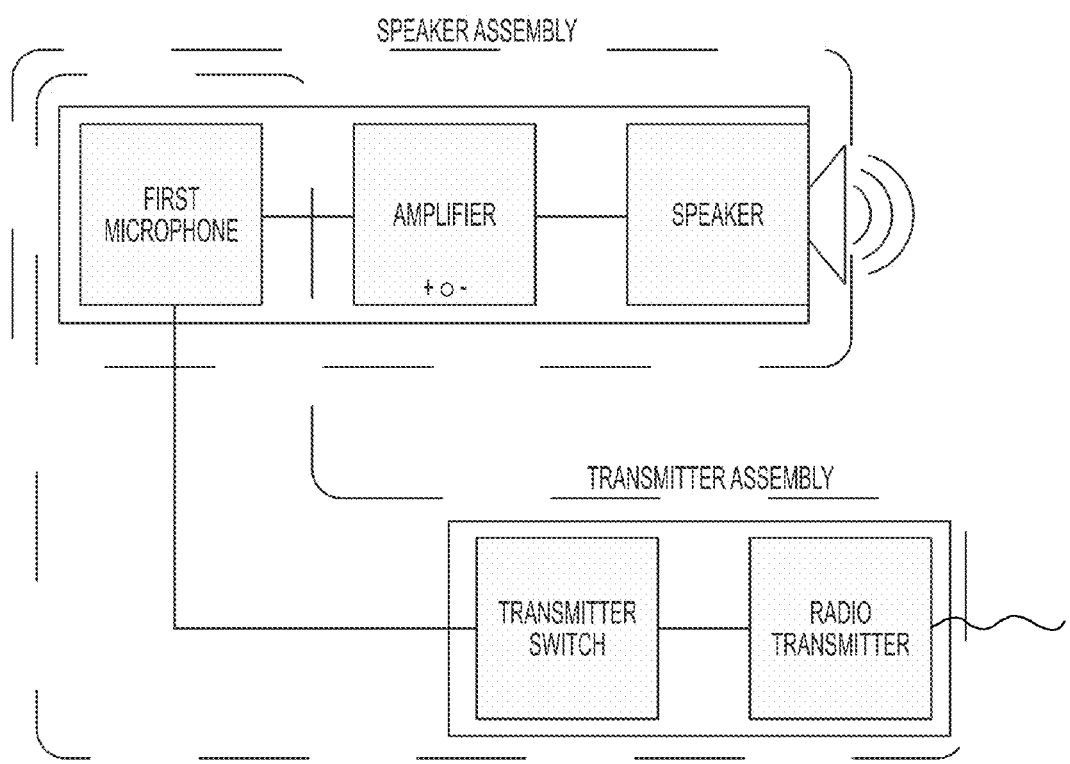
FIG. 1 is a diagram of one embodiment of a prior art voice transmission system.

Voice transmission systems for protective masks are well known in the art and are described by their form of output. As shown in FIG. 1, the typical prior art voice transmission systems are the speaker assembly and the radio transmitter assembly systems. The speaker assembly transmits audible sound from a speaker located in the immediate area of the protective mask, usually mounted on the mask. The radio transmitter assembly systems transmit the sound as a radio frequency which cannot be heard by humans without a receiver to convert the radio frequency back to sound.

As shown in FIG. 1, the prior art speaker assembly comprises speaker assembly components comprised of a first microphone, an amplifier, a power source and a speaker. The first microphone may be located inside the gas mask or outside of the gas mask while the amplifier, battery and speaker are usually located outside of the gas mask. In the most recent evolutions the amplifier, power source and speaker are located or mounted directly on the mask. The speaker assembly components are configured so that the amplifier amplifies a signal originating from the first microphone to an amplified signal, and the speaker converts the amplified signal to sound.

In one embodiment, the power source is a battery which is part of the speaker assembly. In one embodiment, the battery is located in the amplifier (represented by the "+ o –" in FIGS. 1 through 4). In such embodiments the battery provides the electrical current which amplifies the electrical signal coming from the first microphone. In an alternative embodiment the amplifier may be powered by a source other than the battery in the speaker assembly, such as a battery in the radio transmitter. Accordingly, the battery in the speaker assembly is considered an optional component.

The first microphone may be a static or a dynamic microphone. Static microphones use capacitance change or piezoelectricity to produce an electrical signal from air pressure variations. Dynamic microphones use electromagnet induction to produce an electrical signal from air pressure variations. In this manner, the sound spoken into the microphone is converted into an electrical signal. This electrical signal originates from the microphone. The signal originating from the microphone is passed through the mask usually through what is known in the art of protective masks as a "pass-through" (one example of a pass through is described in U.S. Pat. No. 7,457,427 to Birli et al.) which protects the integrity of the gas seal, to the amplifier. The signal originating from the microphone is then amplified by the amplifier and transferred to the speaker which converts the amplified signal to produce an audible sound in the user's environment.

Figure 2:
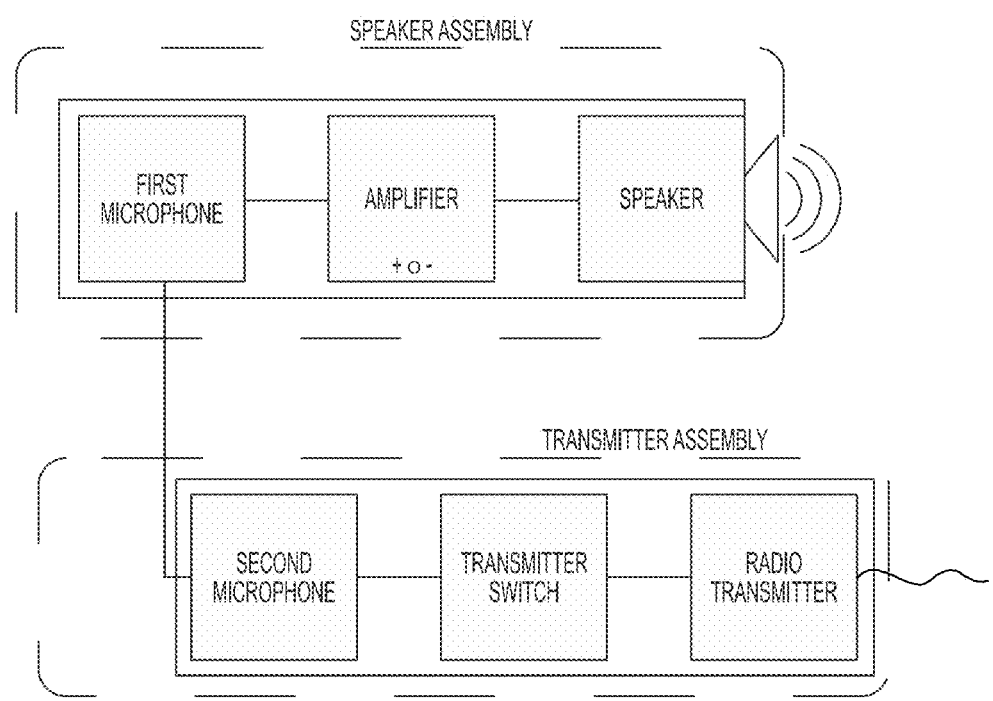
FIG. 2 is a diagram of one embodiment of a prior art voice transmission system.

In one embodiment, as shown in FIG. 1, the same microphone can be used to receive the air pressure variations from the user, produce the electrical signal and transfer the electrical signal to the radio transmitter for conversion into a radio frequency. In such an embodiment there is only one microphone, the first microphone. In an alternative embodiment as shown in FIG. 2, multiple microphones are used with the first microphone transmitting the signal to the amplifier and the second microphone transmitting the signal to the radio transmitter. In the specification, the term the first microphone refers to a microphone whose signal is amplified to a speaker and the term radio transmitter microphone refers to a microphone whose signal is converted to radio frequency by the radio transmitter. When only one microphone exists the radio transmitter microphone is both the first microphone and the radio transmitter microphone.

As shown in FIG. 1, the prior art radio transmitter assembly comprises radio transmitter assembly components comprised of a radio transmitter microphone selected from the group consisting of the first microphone of the speaker assembly or an optional second microphone (the optional second microphone shown in prior art FIG. 2), a radio transmitter switch and a radio transmitter. The radio transmitter microphone may be located inside the gas mask or outside of the gas mask while the radio transmitter switch and radio transmitter are usually located outside the gas mask. The second microphone, like the first microphone, may be a static or a dynamic microphone. The radio transmitter may also be a transceiver which emits radio frequency as well as transmitting radio frequency. The radio transmitter assembly is configured so that the radio transmitter switch is capable of allowing or preventing the radio transmitter from transmitting an electronic signal converted from a signal originating from the radio transmitter microphone.

One of ordinary skill will readily understand that a radio transmitter switch is not limited to a switch but may include buttons, knobs, switches, toggle switches, rotary switches, biased switches, dials, diaphragms and the like. In some parlance, it has become known as a push-to-talk device which depresses a diaphragm to make the connections in the switch. The advantage of the diaphragm is that it provides a degree of moisture protection. Usually the switch will be of either a single pull, double throw or double pull, double throw configuration.

In the prior art as shown in FIGS. 1 and 2, the speaker is connected to the amplifier while the amplifier is connected to the first microphone and the first microphone is connected to the radio transmitter assembly, however there is no communication connection between the radio transmitter switch and the speaker assembly. The radio transmitter switch is capable of allowing or preventing the radio transmitter from transmitting an electronic signal converted from the signal originating from the radio transmitter microphone (the first microphone in FIG. 1 or the second microphone in FIG. 2). Accordingly, in the prior art the sound output from the speaker and the radio transmitter frequency transmission are controlled independently. This requires the user to manually manipulate at least two devices, i.e. buttons, knobs, switches, toggle switches, rotary switches, biased switches, dials, diaphragms and the like to eliminate the sound output from the speaker while using the radio transmitter.

Figure 3:
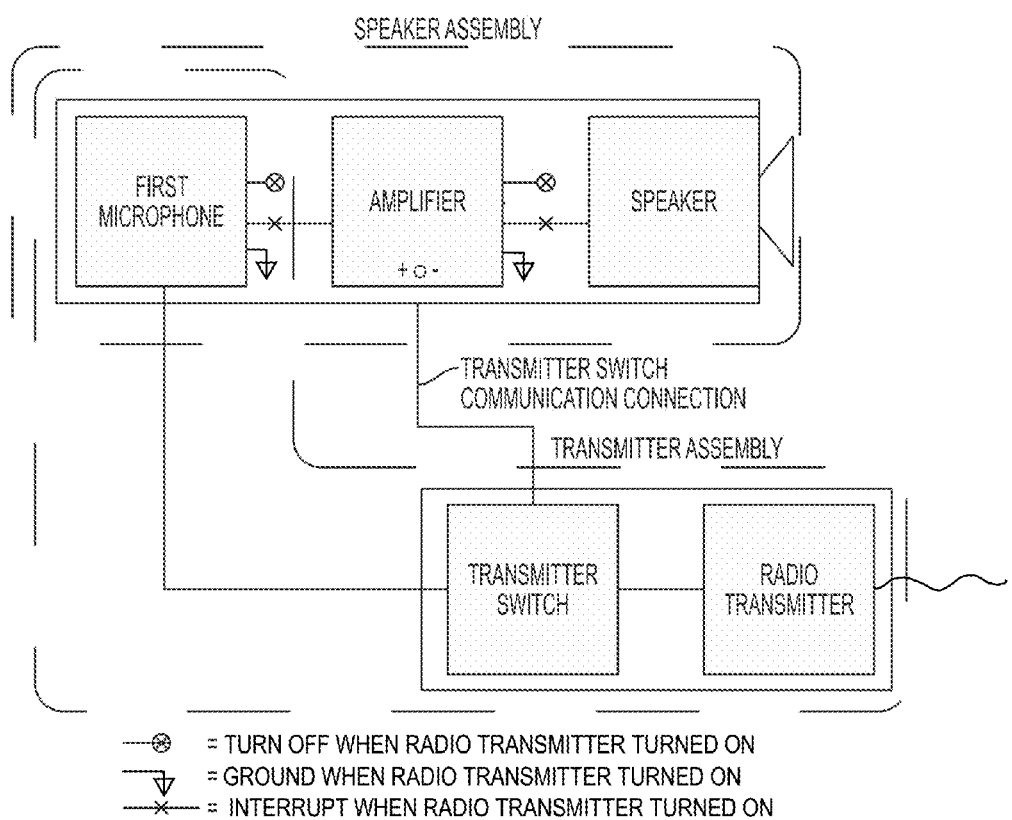
FIG. 3 is a diagram of one embodiment of the improved voice transmission system.
Figure 4:
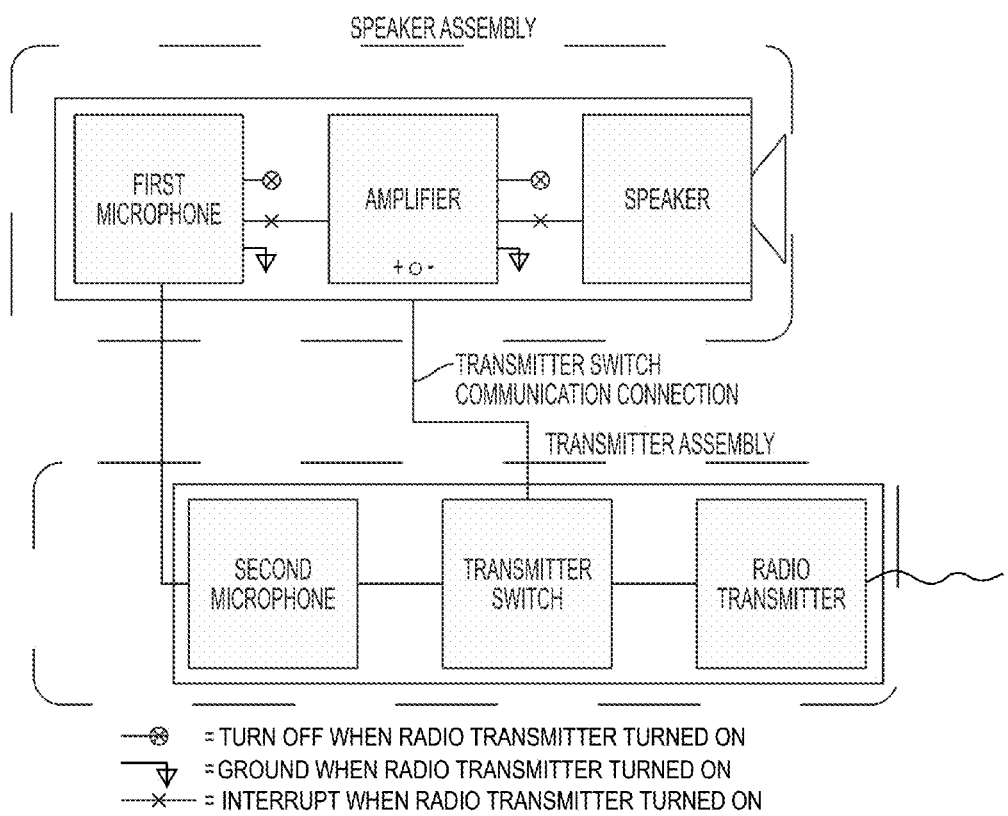
FIG. 4 is a diagram of one embodiment of the improved voice transmission system.

What the inventor has discovered is that, by providing a communication connection between the radio transmitter switch and at least one device selected from the speaker assembly components as shown in FIGS. 3 and 4, the sound output from the speaker and the frequency transmission from the radio transmitter can be simultaneously controlled. The communication connection between the radio transmitter switch and the at least one device selected from the speaker assembly components prevents the speaker assembly from emitting the sound from the speaker when the radio transmitter switch allows the radio transmitter to transmit the electronic signal converted from the signal originating from the radio transmitter microphone.

In one embodiment as shown in FIGS. 3 and 4, the radio transmitter switch communication connection connects the at least one speaker assembly component to ground (as represented by the downward pointing arrow) when the radio transmitter switch allows the radio transmitter to transmit the electronic signal converted from the signal originating from the radio transmitter microphone (the first microphone in FIG. 3 or the second microphone in FIG. 4) thereby disabling the at least one speaker assembly component. In one such embodiment, the speaker assembly component that is connected to ground is the amplifier. In an alternative embodiment, the speaker assembly component that is connected to ground is the speaker. In another alternative embodiment, the speaker assembly component that is connected to ground is the first microphone. In one embodiment, the radio transmitter switch shares a common ground with the radio transmitter microphone and the speaker assembly. By connecting the at least one speaker assembly component to the common ground, the speaker will not transmit sound in the users environment. Simultaneously, the signal originating from the radio transmitter microphone is passed to the radio transmitter where it is converted to radio frequency.

In another embodiment as shown in FIGS. 3 and 4, the radio transmitter switch communication connection interrupts the connection (as shown by the solid line with the "X") of at least one of the speaker assembly components to one of the other speaker assembly components when the radio transmitter switch allows the radio transmitter to transmit the electronic signal converted from the signal originating from the radio transmitter microphone (the first microphone in FIG. 3 or the second microphone in FIG. 4) thereby disabling the speaker assembly. One example of such an interruption is a loop where the electronic signal from one speaker assembly component is passed through the communication connection through the transmitter switch returning to the next speaker assembly component. In one such embodiment, the connection between the amplifier and the speaker is interrupted. In another such embodiment, the connection between the amplifier and the power source is interrupted. In another such embodiment, the connection between the first microphone and the amplifier is interrupted. By interrupting the communication connection between at least one of the speaker assembly components to one of the other speaker assembly components, the speaker will not transmit sound in the user's environment. Simultaneously, the signal originating from the radio transmitter microphone is passed to the radio transmitter where it is converted to radio frequency.

In another embodiment as shown in FIGS. 3 and 4, the radio transmitter switch communication connection turns off (as represented by the solid line with the "X" in a circle) at least one of the speaker assembly components when the radio transmitter switch allows the radio transmitter to transmit the electronic signal converted from the signal originating from the radio transmitter microphone (the first microphone in FIG. 3 or the second microphone in FIG. 4) thereby disabling the speaker assembly. In one such embodiment, the speaker is turned off. In another such embodiment, the amplifier is turned off. In another such embodiment, the first microphone is turned off. By turning off at least one of the speaker assembly components, the speaker will not transmit sound in the user's environment. Simultaneously, the signal originating from the radio transmitter microphone is passed to the radio transmitter where it is converted to radio frequency.

It is known in the art that many of the speaker assembly components have an integrated circuit capable of receiving a signal that turns the speaker assembly component off. A signal is sent from the radio transmitter switch to the integrated circuit in one of the speaker assembly components to turn off the speaker assembly component.

The present invention can also be said to comprise a radio transmitter switch for a protective mask communication system. The radio transmitter switch comprises a communication connection configured to communicate with a speaker assembly in a manner which prevents the speaker assembly from emitting audible sound from the speaker when the radio transmitter switch allows a radio transmitter to transmit an electronic signal (radio frequency) converted from a signal originating from a radio transmitter microphone. In one embodiment of the radio transmitter switch, the radio transmitter is allowed to transmit the electronic signal converted from the signal originating from the radio transmitter microphone by allowing the electronic signal converted from a signal originating from the radio transmitter microphone to pass to the radio transmitter. In an alternative embodiment of the radio transmitter switch, the radio transmitter is allowed to transmit the electronic signal converted from the signal originating from the radio transmitter microphone by turning on the power circuit of the radio transmitter. In another embodiment of the radio transmitter switch, the radio transmitter switch prevents the speaker assembly from emitting an audible sound by connecting at least one of the speaker assembly components to ground through the communication connection. In yet another embodiment of the radio transmitter switch, the radio transmitter switch prevents the speaker assembly from emitting an audible sound by sending a signal, such as a voltage from the radio transmitter or radio transmitter microphone, through the communication connection to at least one of the speaker assembly components having a shut down switch. In another embodiment of the radio transmitter switch, the radio transmitter switch prevents the speaker assembly from emitting an audible sound by interrupting the connection through the communication connection between any one of the speaker assembly components.

Figure 6:
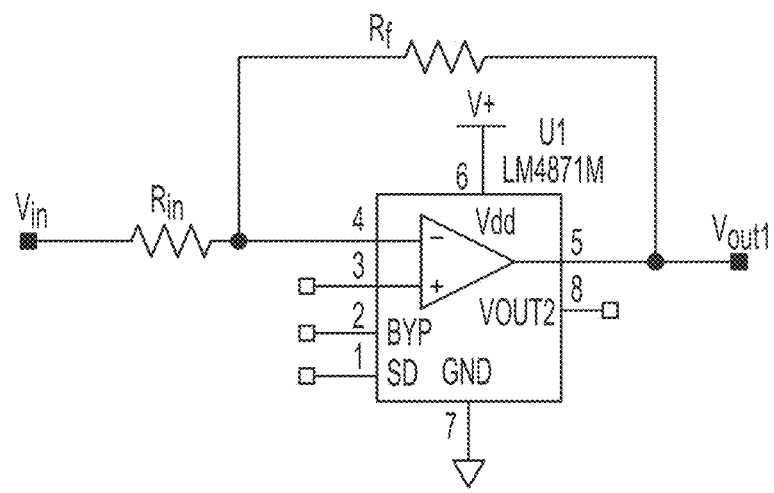
FIG. 6 is a diagram of one embodiment of an integrated circuit used in the improved voice transmission system.

In one embodiment where the radio transmitter switch communication connection turns off at least one of the speaker assembly components, the amplifier often comprises an integrated circuit. The integrated circuit has an amplifier muting signal receiver that is capable of receiving a voltage from the radio transmitter switch via a shutdown pin ("SD") located in the integrated circuit as shown in FIG. 6. The voltage can originate from a battery in the radio transmitter and be sent from the radio transmitter switch to the shut down pin on the integrated circuit, activating the muting signal receiver. Accordingly, the radio transmitter switch communication connection places the amplifier switch in a muted position thereby turning the amplifier off and preventing the speaker from transmitting sound in the user's environment.

Figure 5:
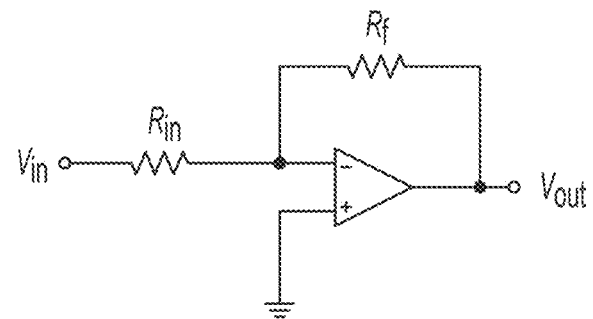
FIG. 5 is a diagram of a circuit for an amplifier.

These integrated circuits for amplifiers are well known in the art. An example of an integrated circuit for an amplifier which can be used in the current invention is an LM4871M integrated circuit available from Texas Instruments, Dallas Tex., USA. In the simplest configuration as shown in FIG. 5, a circuit for an amplifier comprises a voltage input ("$V_{in}$") connected to an input resistor ("$R_{in}$"), which is connected to a fixed resistor ("$R_f$") which is connected to a voltage output ("$V_{out}$"). In the typical integrated circuit for an amplifier, the voltage output is equal to the voltage input multiplied by the voltage restriction from the fixed resistor over the voltage restriction from the input resistor ($V_{out}=V_{in}\times(R_f/R_{in})$). When the device being amplified is activated, a signal is sent to the voltage input and is transmitted through the integrated circuit to the voltage output which produces the amplified signal.

As shown in FIG. 6, the integrated circuit for the amplifier (U1) comprises a shutdown pin ("SD"), a bypass pin ("BYP"), a positive voltage input field effect transistor drain ("Vdd") and a ground pin ("GND"). The shutdown pin is typically connected to ground such that when a signal is sent to the shutdown pin, instead of shutting down or muting the speaker, the signal is diverted inside the integrated circuit to ground. In such an embodiment, the radio transmitter switch communication connection is connected to the shutdown pin and, when the radio transmitter switch is activated, it will send a signal (e.g. from the radio transmitter microphone) to the radio transmitter activating the radio transmitter while simultaneously turning off at least one device selected from the group consisting of the first microphone, the amplifier and the speaker. Where the amplifier further comprises a battery, the signal sent from the radio transmitter switch will turn off at least one device selected from the group consisting of the radio transmitter microphone, the amplifier, the speaker, and the battery.

The inventors have discovered that by modifying the shutdown pin to receive a signal from the radio transmitter microphone the user can selectively shut down or mute the amplifier. In one embodiment, the amplifier is connected to the radio transmitter microphone and the radio transmitter microphone is connected to the radio transmitter switch. The radio transmitter switch is also connected to the amplifier shutdown pin. When the radio transmitter switch is engaged it sends a signal (e.g. voltage from the radio transmitter) to the amplifier activating the shut down input and thereby shutting down or muting the amplifier. Simultaneously, the radio transmitter switch activates the radio transmitter.

In one embodiment having a second microphone, the amplifier is connected to the first microphone and the first microphone is connected to the radio transmitter switch. The radio transmitter switch is also connected to the amplifier shutdown pin. When the radio transmitter switch is engaged it sends a signal (e.g. voltage from the radio transmitter or the second microphone) to the amplifier activating the shut down input and thereby shutting down or muting the amplifier. Simultaneously, the radio transmitter switch sends activates the radio transmitter.

Figure 7:
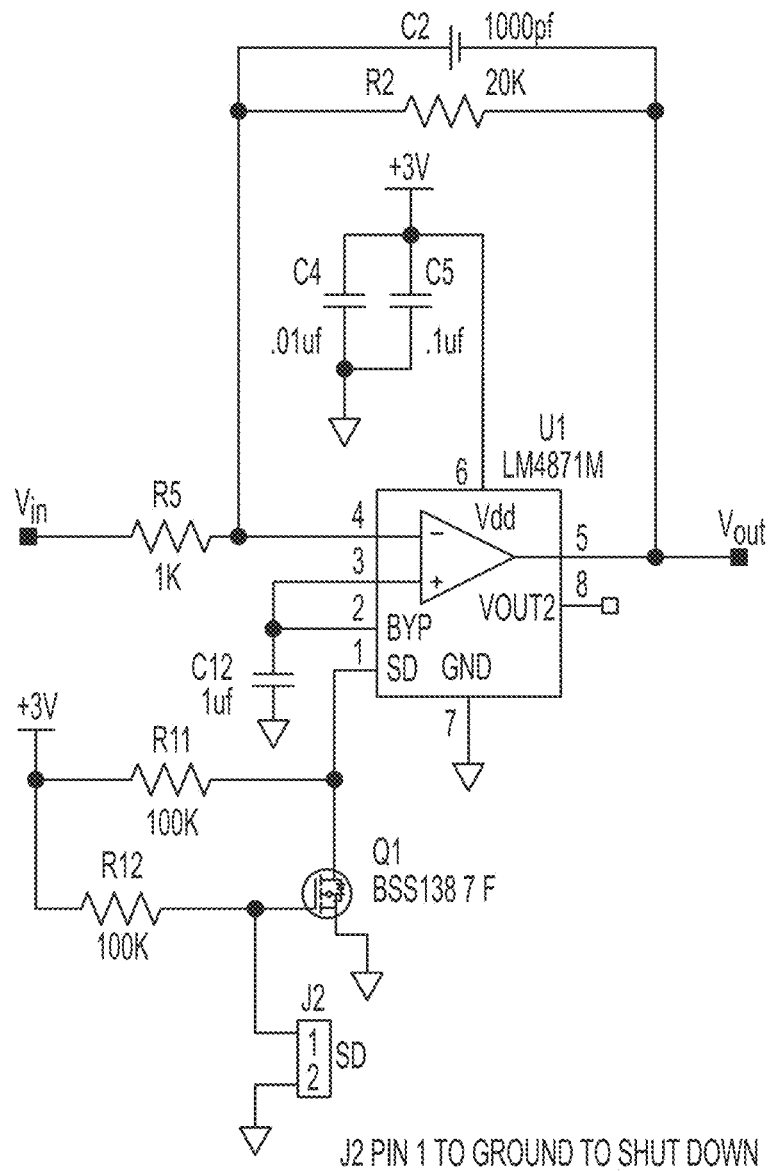
FIG. 7 is a diagram of one embodiment of an integrated circuit used in the improved voice transmission system.

The signal sent from the radio transmitter microphone can be either an active high control signal or an active low control signal. The amplifier may be configured to receive either an active high control signal or an active low control signal. Where the radio transmitter microphone sends an active high control signal the amplifier may require further modification to protect the components inside the amplifier.

Where the radio transmitter microphone sends an active low control signal to the amplifier and the amplifier is configured to receive an active high control signal, the amplifier requires further modification to "invert" the active low control signal so that it appears as an active high control signal when it is received by the amplifier. As shown in FIG. 7, the active low control signal is "inverted" by way of a transistor (Q1) and at least two resistors (R11 and R12). One such transistor is a BSS138 7 F N-Channel Enhancement mode MOSFET, which is well known industry circuitry that is not essential to the invention.

Figure 8:
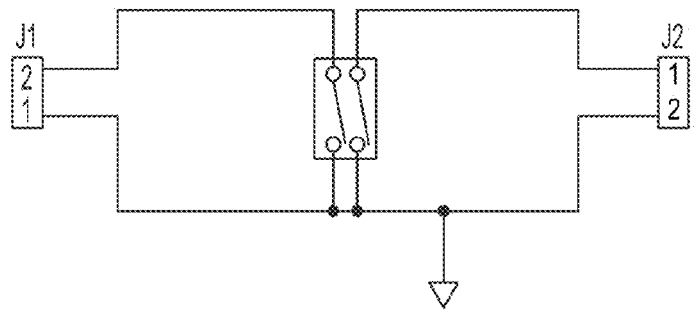
FIG. 8 is a diagram of one embodiment of a transmitter switch.

FIG. 8 demonstrates one radio transmitter switch for selectively shutting down or muting the amplifier. As shown in FIG. 8, the radio transmitter is connected to the radio transmitter switch through a first junction (J1) located on the radio transmitter having a two pin connection. The radio transmitter switch is further connected to the amplifier through a second junction (J2) (see also FIG. 7) having a two pin connection via the two wires forming the communication connection (1 and 2). When the radio transmitter switch is activated, it activates the radio transmitter while simultaneously connecting pins 1 and 2 of J2 of the amplifier to ground (typically the common ground from the microphone) via connecting pins 1 and 2 of J1 thereby shutting down or muting the amplifier.

Figure 9:
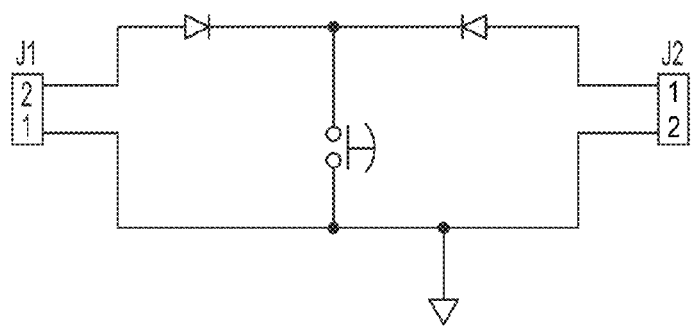
FIG. 9 is a diagram of one embodiment of a transmitter switch.

FIG. 9 demonstrates another radio transmitter switch for selectively shutting down or muting the amplifier. As shown in FIG. 9, the radio transmitter is connected to the radio transmitter switch through a first junction (J1) located in the radio transmitter having a two pin connection. The radio transmitter switch is further connected to the amplifier through a second junction (J2) (see also FIG. 7) having a two pin connection via the two wires forming the communication connection (1 and 2). The radio transmitter switch further comprises a first diode and a second diode. When the radio transmitter switch is activated, the radio transmitter is activated by completing the circuit. Simultaneously the first diode and the second diode prevent interference between the amplifier and the radio transmitter thereby preventing the amplifier from transmitting.

Figure 10:
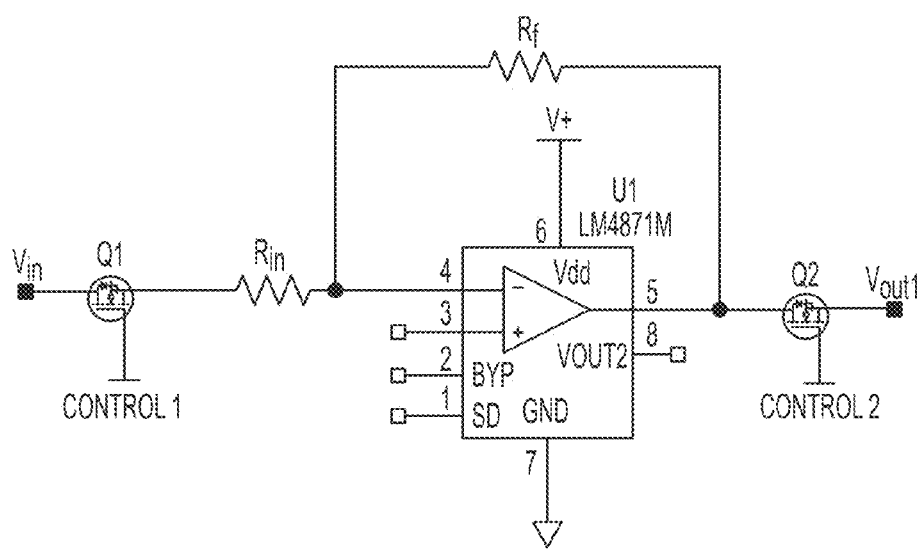
FIG. 10 is a diagram of one embodiment of an integrated circuit used in the improved voice transmission system.

In an alternative embodiment as shown in FIG. 10, the amplifier output can be controlled without the use of a radio transmitter switch. In such an embodiment, there is a first controller (Control 1) connected to a first transistor (Q1) between the voltage input and the input resistor and a second controller (Control 2) connected to a second transistor (Q2) between the amplifier and the voltage output. When a signal is applied to either the first controller or the second controller the signal flow from the voltage input to the voltage output is interrupted causing the amplifier to mute. In this embodiment the first transistor and/or the second transistor act as radio transmitter switches.

I claim:

1. An improved voice transmission system for a protective mask comprising a speaker assembly and a radio transmitter assembly,
    wherein the speaker assembly comprises speaker assembly components comprised of a first microphone, an amplifier, a power source and a speaker with the first microphone, amplifier, power source and speaker configured so that the amplifier amplifies a signal originating from the first microphone to an amplified signal and the speaker converts the amplified signal to a sound;
    wherein the radio transmitter assembly comprises radio transmitter assembly components comprised of a radio transmitter microphone selected from the group consisting of the first microphone of the speaker assembly or an optional second microphone, a radio transmitter switch located outside the protective mask and a radio transmitter, wherein the radio transmitter microphone, radio transmitter and radio transmitter switch are configured so that the radio transmitter switch is capable of allowing or preventing the radio transmitter from transmitting an electronic signal converted from a signal originating from the radio transmitter microphone, wherein the improvement comprises:
    a radio transmitter switch communication connection from the radio transmitter switch to at least one device selected from the speaker assembly components which prevents the speaker assembly from emitting the sound from the speaker when the radio transmitter switch allows the radio transmitter to transmit the electronic signal converted from the signal originating from the radio transmitter microphone.

2. The improved voice transmission system of claim 1, wherein the radio transmitter switch communication connection connects at least one speaker assembly component to ground when the radio transmitter switch allows the radio transmitter to transmit the electronic signal converted from the signal originating from the radio transmitter microphone thereby disabling the at least one speaker assembly component.

3. The improved voice transmission system of claim 2, wherein the at least one speaker assembly component is the amplifier.

4. The improved voice transmission system of claim 1, wherein the radio transmitter switch communication connection interrupts a connection of at least one speaker assembly component to one of the other speaker assembly components when the radio transmitter switch allows the radio transmitter to transmit the electronic signal converted from the signal originating from the radio transmitter microphone thereby disabling the speaker assembly.

5. The improved voice transmission system of claim 4, wherein the at least one speaker assembly component is the power source.

6. The improved voice transmission system of claim 1, wherein the radio transmitter switch communication connection turns off at least one speaker assembly component when the radio transmitter switch allows the radio transmitter to transmit the electronic signal converted from the signal originating from the radio transmitter microphone thereby disabling the speaker assembly.

7. The improved voice transmission system of claim 6, wherein the at least one speaker assembly component is the amplifier.

8. The improved voice transmission system of claim 7, wherein the amplifier further comprises an integrated circuit having an amplifier switch capable of turning the amplifier off and the radio transmitter switch communication connection places the amplifier switch in an off position turning the amplifier off.

9. The improved voice transmission system of claim 1, wherein the power source is a battery.

10. The improved voice transmission system of claim 9, wherein the battery is located in the amplifier.

11. An improved radio transmitter switch for a protective mask comprising a speaker assembly and a radio transmitter assembly,
    wherein the speaker assembly comprises speaker assembly components comprised of a first microphone, an amplifier, a power source and a speaker with the first microphone, amplifier, power source and speaker configured so that the amplifier amplifies a signal originating from the first microphone to an amplified signal and the speaker converts the amplified signal to a sound;
    wherein the radio transmitter assembly comprises radio transmitter assembly components comprised of a radio transmitter microphone selected from the group consisting of the first microphone of the speaker assembly or an optional second microphone, the radio transmitter switch and a radio transmitter, wherein the radio transmitter microphone, radio transmitter and radio transmitter switch are configured so that the radio transmitter switch is capable of allowing or preventing the radio transmitter from transmitting an electronic signal converted from a signal originating from the radio transmitter microphone, wherein the improvement comprises:

a communication connection in the radio transmitter switch configured to communicate with the speaker assembly in a manner which prevents the speaker assembly from emitting audible sound from the speaker when the radio transmitter switch allows the radio transmitter to transmit the electronic signal converted from the signal originating from the radio transmitter microphone.

12. The improved radio transmitter switch of claim 11, wherein the radio transmitter is allowed to transmit the electronic signal converted from the signal originating from the radio transmitter microphone by allowing the electronic signal converted from the signal originating from the radio transmitter microphone to pass to the radio transmitter.

13. The improved radio transmitter switch of claim 11, wherein the radio transmitter is allowed to transmit the electronic signal converted from the signal originating from the radio transmitter microphone by turning on a power circuit of the radio transmitter.

14. The improved radio transmitter switch of claim 11, wherein the radio transmitter switch prevents the speaker assembly from emitting an audible sound by connecting at least one of the speaker assembly components to ground through the communication connection.

15. The improved radio transmitter switch of claim 11, wherein the radio transmitter switch prevents the speaker assembly from emitting an audible sound by sending a signal through the communication connection to at least one of the speaker assembly components having a shut down switch.

16. The improved radio transmitter switch of claim 11, wherein the radio transmitter switch prevents the speaker assembly from emitting an audible sound by interrupting a connection through the communication connection between any one of the speaker assembly components.

* * * * *